(12) United States Patent
Marshall et al.

(10) Patent No.: US 9,368,208 B1
(45) Date of Patent: Jun. 14, 2016

(54) NON-VOLATILE LATCH USING MAGNETO-ELECTRIC AND FERRO-ELECTRIC TUNNEL JUNCTIONS

(71) Applicants: The Board of Regents of The University of Texas System, Austin, TX (US); The Research Foundation for the State University of New York STOR—University at Buffalo, Amherst, NY (US); Intel Corporation, Santa Clara, CA (US)

(72) Inventors: Andrew Marshall, Dallas, TX (US); Jonathan P. Bird, Buffalo, NY (US); Uttam Singisetti, East Amherst, NY (US); Dmitri E. Nikonov, Beaverton, OR (US)

(73) Assignees: Board of Regents, The University of Texas System, Austin, TX (US); The Research Foundation For The State University of New York University At Buffalo, Amherst, NY (US); Intel Corporation, Santa Clara, CA (US)

( * ) Notice: Subject to any disclaimer, the term of this patent is extended or adjusted under 35 U.S.C. 154(b) by 0 days.

(21) Appl. No.: 14/690,923

(22) Filed: Apr. 20, 2015

(51) Int. Cl.
 *G11C 5/06* (2006.01)
 *G11C 14/00* (2006.01)
 *G11C 11/419* (2006.01)
 *G11C 5/08* (2006.01)

(52) U.S. Cl.
 CPC .............. *G11C 14/0081* (2013.01); *G11C 5/08* (2013.01); *G11C 11/419* (2013.01)

(58) Field of Classification Search
 CPC ...................................................... G11C 11/22
 USPC .................................... 365/65, 158, 154, 148
 See application file for complete search history.

(56) References Cited

U.S. PATENT DOCUMENTS

| | | | | |
|---|---|---|---|---|
| 7,079,412 | B2* | 7/2006 | Chen ....................... | G11C 17/14 365/100 |
| 8,942,027 | B1* | 1/2015 | Chuang ................ | G11C 14/009 365/148 |
| 9,171,618 | B2* | 10/2015 | Fujita ................. | G11C 14/0054 |
| 2010/0271866 | A1* | 10/2010 | Sakimura ............... | G11C 11/16 365/158 |

OTHER PUBLICATIONS

Yoda, H. et al., "Progress of STT-MRAM Technology and the Effect on Normally-off Computing Systems" Electron Devices Meeting (IEDM), 2012 IEEE International.

* cited by examiner

*Primary Examiner* — Connie Yoha
(74) *Attorney, Agent, or Firm* — Talem IP Law, LLP

(57) ABSTRACT

A non-volatile memory circuit includes an SRAM cell with magnetoelectric or ferroelectric structures for maintaining data within the SRAM cell even with power off. In some implementations, the magnetoelectric and ferroelectric structures can be programmed using a NOR or tristate gate coupled to an internal state of the SRAM cell. In other implementations, the magnetoelectric and ferroelectric structures can be configured as programmable resistors in the cross-coupled signal path of the SRAM inverters.

19 Claims, 12 Drawing Sheets

NON-VOLATILE LATCH USING MAGNETO-ELECTRIC AND FERRO-ELECTRIC TUNNEL JUNCTIONS

This invention was made with government support under Cooperative Agreement No. 70NANB12H107 awarded by NIST. The government has certain rights in the invention.

BACKGROUND

Static Random Access Memory (SRAM) and Dynamic Random Access Memory (DRAM) are volatile memories, which only maintain data while powered. Of these two volatile memories, SRAM can provide faster read and write speeds, but provides fewer bits of storage capacity for the same number of transistors. Therefore, DRAM is often used where capacity (and price) is more important; and SRAM is often used where speed is more important than price. For example, DRAM may be used as main memory and SRAM may be used as cache memory. In contrast to volatile memories, non-volatile memory can preserve data even when no power is applied. Examples of non-volatile memory include Flash, phase change memory, and even memory based on magnetic devices (e.g., magneto-electric-based memory, magnetoresistive random access memory, and spin-transfer torque magnetic random access memory). Common applications for non-volatile memory include storage drives.

As memory technologies develop, improvements to at least one of, if not more than two of, speed, power consumption, endurance, density, and cost are desirable. One growing area for storage is in data centers—particularly with the increasing amount of data that is being stored in the cloud. For example, it can be desirable to produce a module that can be integrated into a main memory of a computing platform, perform workloads at high speeds available to SRAM and DRAM, yet be persistent and provide data retention in the event of a power failure or system crash.

BRIEF SUMMARY

Non-volatile latches are described that include an SRAM cell and two magnetic elements that are connected within the SRAM cell to preserve the information in the SRAM cell when the power is off. In one implementation, the magnetic elements are magneto-electric structures. In another implementation, the magnetic elements are ferromagnetic structures. In yet another implementation, ferroelectric structures are used.

DETAILED DESCRIPTION

Non-volatile latches are provided that takes advantage of the fast read write speeds of SRAM while enabling the state of a memory cell to be reestablished upon powering back up. A voltage controlled magnetic tunnel junction or ferromagnetic tunnel junction is used to provide a low power, small area, non-volatile element in each memory cell. In operation, the described non-volatile latch includes an SRAM cell with two magnetic elements that, when the power is turned off, the information in the memory cell is preserved in the magnetic state. Reading and writing to memory can be carried out using via SRAM read/write circuitry.

Advantageously, the memory cell containing the non-volatile latch can appear as standard SRAM to external circuitry, but be able to retain information when turned off. Internally in the memory cell, a programming mechanism is provided that changes the state of magnetic elements to enable the appropriate state to be re-asserted after the power comes back on. This programming mechanism is implemented through the connections of the magnetic elements to the cross coupled inverter structure of the SRAM cell.

Figure 1:
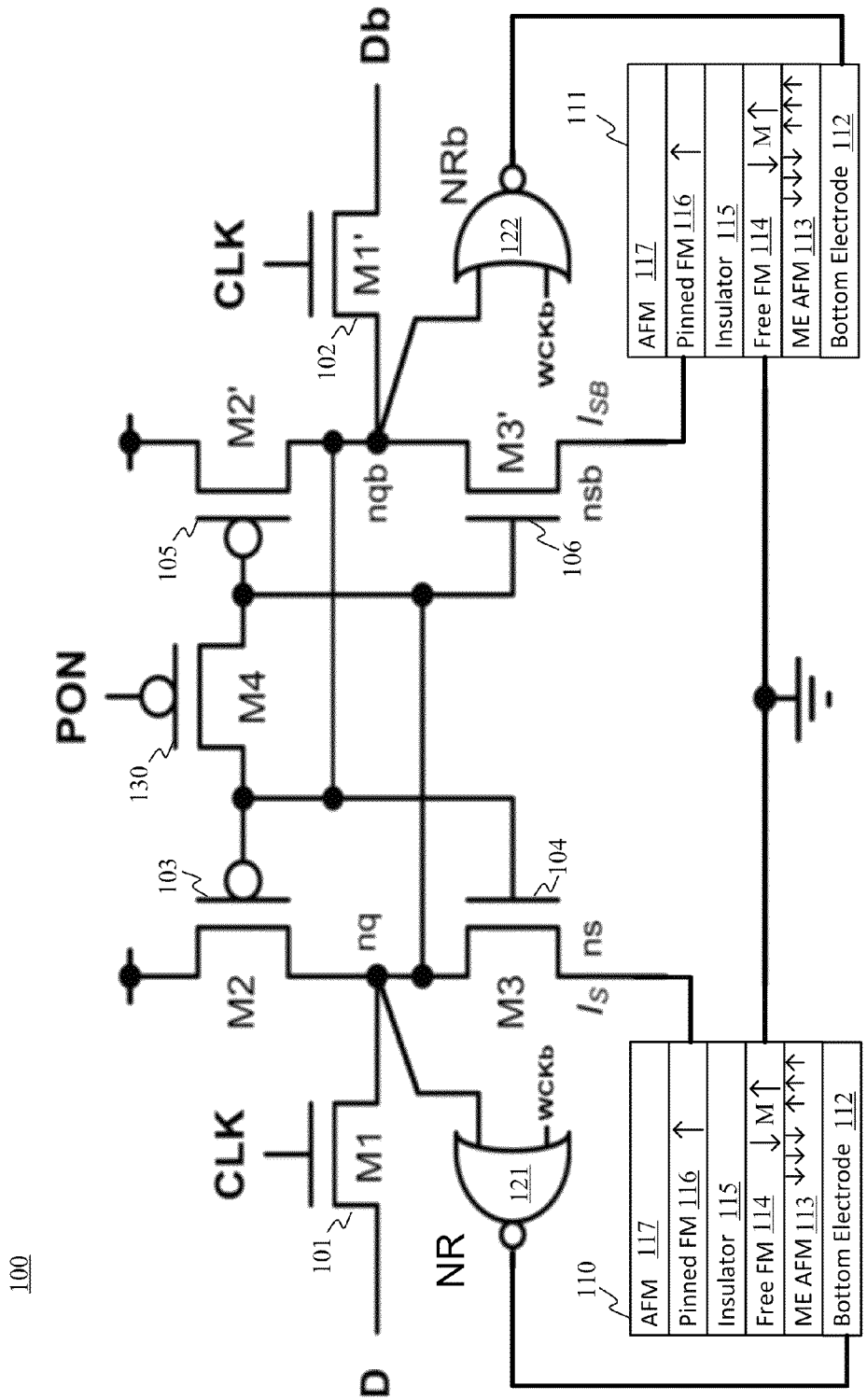
FIG. 1 illustrates a non-volatile latch having two magneto-electric devices according to an example implementation.

FIG. 1 illustrates a non-volatile latch having two magneto-electric devices according to an example implementation. In the design shown in FIG. 1, the non-volatile latch 100 includes a standard SRAM 100 configuration of access transistors M1 101 and M1' 102 and cross coupled invertors with transistors M2 103, M3 104, M2' 105, and M3' 106. Access transistors M1 101 and M1' 102 are generally controlled by a signal (e.g., CLK) from a word line to connect and disconnect a bit line and bit-bar line (inverse bit line) to the cross coupled invertors. When the access transistors M1 101 and M1' 102 are turned on, data D and Db can be input (via bit/bit-bar lines) to the latch formed by the cross coupled invertors during a write operation and enable data output nq and nqb to be read out (via bit/bit-bar lines) during a read operation. Thus, programming the SRAM portion can be carried out in a manner according to conventional SRAM.

In addition to the SRAM portion, two magnetoelectric structures 110, 111 are included to retain the data in the cell (forming a non-volatile latch 100) in the event power is off. In this implementation, each of the two magnetoelectric structures 100, 111 has a bottom electrode 112, a magnetoelectric (ME) antiferromagnetic (AFM) layer 113 on the bottom electrode 112, a free ferromagnetic (FM) layer 114 on the ME AFM layer 113, an insulator 115 on the Free FM layer 114, a pinned FM layer 116 on the insulator 115, and an AFM layer 117 on the pinned FM layer 116.

The Free FM 114 of both magnetoelectric structures 110, 111 are connected to ground. The pinned FM layer 116 of one of the magnetoelectric structures 110 is connected to the source of M3 104 and the pinned FM layer 116 of the other of the magnetoelectric structures 111 is connected to the source of M3' 106.

Programming of the two matched magneto-electric structures is carried out by two-input NOR gates NR 121 and NRb 122. NOR gate NR 121 has one input connected to receive a signal from the output node nq of the invertor formed by M2 103 and M3 104 and the other input connected to receive a signal WCKb in order to output a signal that is connected to the bottom electrode 112 of one of the two matched magneto-electric structures (110). Similarly, the NOR gate NRb 122 has one input connected to receive a signal from output node nqb of the inverter formed by M2' 105 and M3' 106 and the other input connected to receive the signal WCKb; the output of NRb is connected to the bottom electrode 112 of the other of the two magneto-electric structures (111).

In some cases, the SRAM portion (of the six transistors 101, 102, 103, 104, 105, and 106) can be part of an array of SRAM cells, for example, as part of a memory cache. The magnetoelectric structures 110, 111 (and programming circuitry such as the NOR gates 121, 122) can be located in proximity to their corresponding SRAM cell portion. For example, the magnetoelectric structures may be stacked or formed below or above the SRAM and programming circuitry (e.g., as a 3D IC). As another example, the magneto-electric structures may be formed on a portion adjacent the SRAM and programming circuitry. In some cases, the six transistor cell, programming circuitry, and magnetoelectric structures (e.g., the non-volatile latch 100) can provide a register file and/or latches in a logic circuit.

The transistors 101, 102, 103, 104, 105, and 106 of the SRAM cell as well as the transistors forming the NOR gates 121, 122 are formed of n-type and p-type field effect transistors (FETs). It should be understood that while complementary metal oxide semiconductor (CMOS)-based SRAM cells and circuitry (e.g., NMOS and PMOS transistors) are illustrated in the drawings, the circuits may be implemented using other field effect transistor technologies, for example tunnel field effect transistor (TFET)-based SRAM cells and circuitry (e.g., as NTFET and PTFET).

In operation, the WCKb signal is normally high. This keeps the output of the NOR gates 121, 122 low and, thus, the bottom "programming" electrode 112 is held at the same potential as the free FM 114 (ground/Vss). Then, to program the states of the two matched magneto-electric structures 110, 111, WCKb is lowered. That is, the bottom electrode 112 then receives a signal that can affect the resistance of the magneto-electric structure 110, 111, enhancing the SRAM state. For example, if M3 104 is "on", the NR-controlled magnetoelectric device 110 is programmed to low resistance.

In general, it is desirable to start in a balanced condition. The two magneto-electric structures 110, 111 are matched so that when the cell is then powered up (e.g., by turning on M4 130 with a power on (PON) signal), the lower resistance side of the two devices will allow M3 or M3' to turn on completely.

In particular, when power is re-applied, the lower resistance magnetoelectric device of the two devices will cause the source of the pull down transistor which it is attached (e.g., M3 104) to hold lower, forcing turn-on of M3 104, nq to be held at the lower voltage, and the SRAM cell to flip into the same state it was in before power-down. Although a power on device (M4 130) is shown, in some implementations this transistor may be omitted.

In some cases, it may be desirable that a "1" stored in the latch portion formed by transistors M2 103, M3 104, M2' 105, and M3' 106 causes a low resistance in the magneto-electric structure (110, 111). In other cases, it may be desirable that a "1" causes a high resistance. These particular implementations can be controlled by switching inputs nq and nqb (while keeping the sources of the transistors M3 104 and M3' 106 connected as shown in FIG. 1) or switching the orientation of the pinned FM. In addition, depending on the programming voltage needed to affect the resistance value of the magneto-electric structure (which can depend on the materials and thicknesses of those materials used), additional step-up and/or step-down circuitry can be included as part of (or associated with) the NOR gates NR 121 and NRb 122. Alternatively or in addition, the NOR gates 121, 122 can have specialized voltage capabilities for this case where the programming voltage range is different than the logic voltage range. In some cases, the WCKb defines a 3-level logic based on a swing from +Vdd (positive Vdd) to −Vdd (negative Vdd or Vss), where the logic level 0 state defines an intermediate low impedance voltage level (e.g., ground) so the output of the NOR gates 121, 122 swing between −Vdd and +Vdd to program the ME AFM 113 level.

Figure 2A:
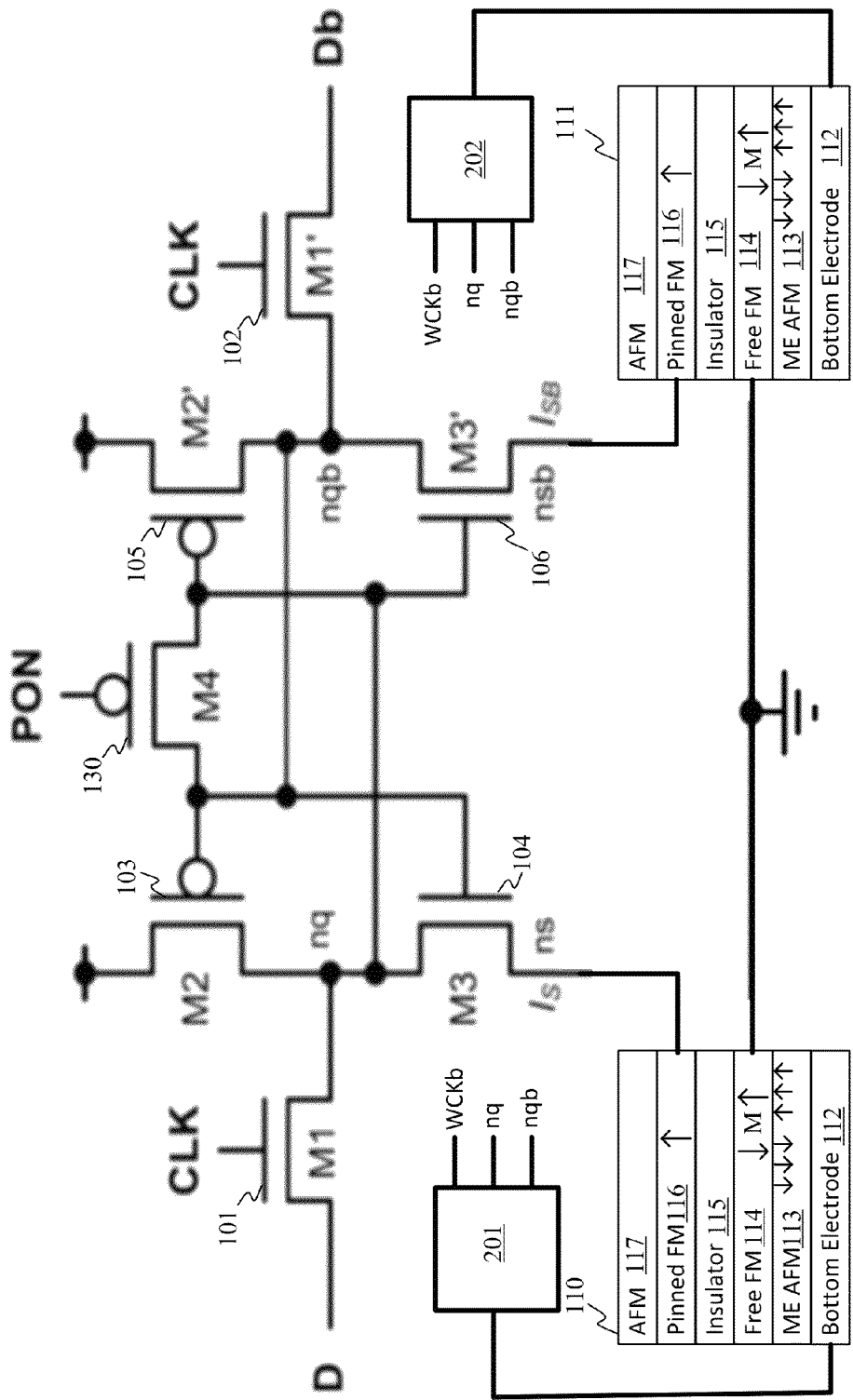
FIG. 2A illustrates a non-volatile latch having two magneto-electric devices according to another example implementation where the NOR gates of FIG. 1 are replaced with a tristate gate configuration.
Figure 2B:
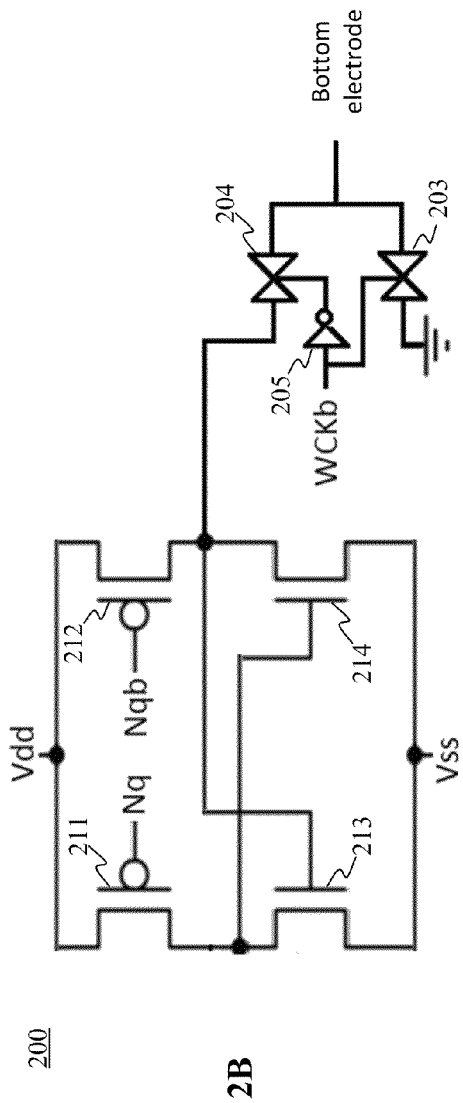
FIG. 2B shows a schematic of an example tristate gate that may be used.

FIG. 2A illustrates a non-volatile latch having two magneto-electric devices according to another example implementation where the NOR gates of FIG. 1 are replaced with a tristate gate configuration. It should be understood that the tristate gate may be a single tristate gate having an output connected to both magneto-electric devices or two tristate gates, each connected to a corresponding magneto-electric device. The selection of a NOR gate or a tristate gate can depend, in some cases, on the bottom electrode voltage. FIG. 2B shows a schematic of an example tristate gate 200 that may be used.

Here, instead of NOR gates, two tristate gates 201, 202 are used to program the magneto-electric structures. Each tristate gate 201, 202 receives the WCKb signal, the output at nq, and the output at nqb. The tristate gate, shown in FIG. 2B as 200, includes two transmission gates; one transmission gate 203 controlled by WCKb and the other transmission gate 204 controlled by the inverse of WCKb (via an inverter 205). The transmission gate 203 controlled by WCKb enables ground/Vss signal to be output to the bottom electrode 112 and the transmission gate 204 controlled by the inverse WCKb enables nq or nqb to provide an output to the bottom electrode 112.

In particular, the nq and nqb signals are applied to the gates of two PMOS (or other p-type FET) transistors 211, 212 that are connected, as common source amplifiers, to cross coupled NMOS (or other n-type FET) transistors 213, 214. The output of the transistor 212 that receives the nqb signal at its gate is connected to the transmission gate 204 controlled by the inverse WCKb to output a signal. When WCKb is at logic level 0, the output is tristated and floats to a nominal intermediate voltage defined by the magnetoelectric device (e.g., 110, 111).

Figure 3:
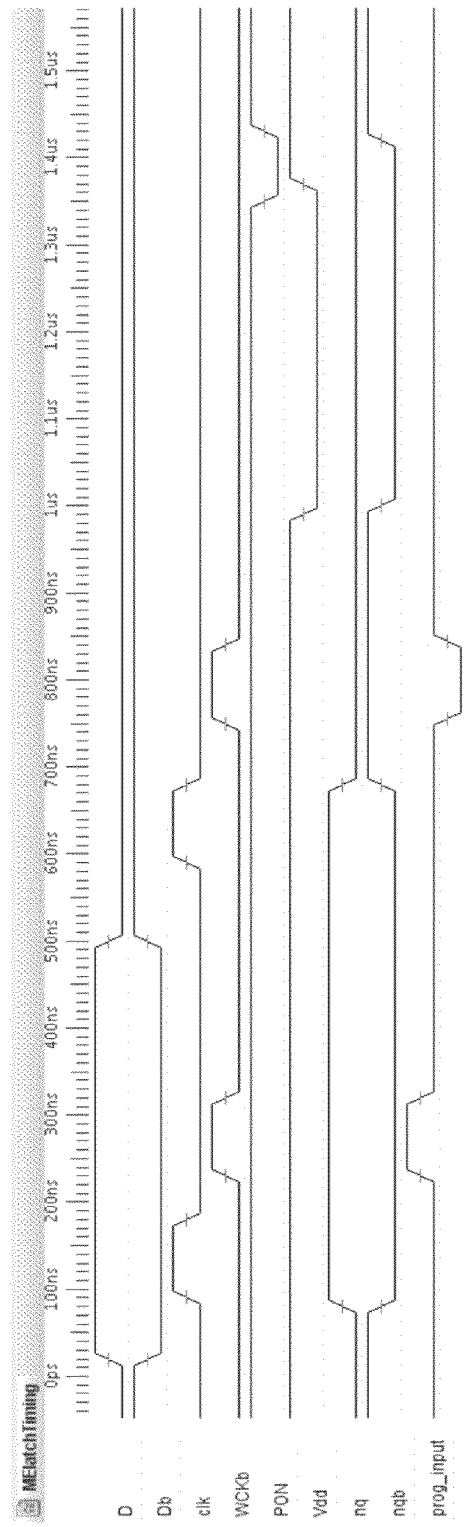
FIG. 3 illustrates a timing diagram that may correspond to operation of the non-volatile latch of FIG. 2A.

FIG. 3 illustrates a timing diagram that may correspond to operation of the non-volatile latch of FIG. 2A. Shown in the timing diagram of FIG. 3 are the signals D, Db, clk, WCKb, PON, Vdd, nq, nqb, and prog_input (the output of the tristate gate 200 which is input to a bottom electrode 112). As previously mentioned, D and Db are the data signals from the bit and bit-bar line, which are written into the memory cell. When writing a '1' (D is high and Db is low), CLK is made high to turn on the access transistors M1 101 and M1' 102. This results in nq going high (and nqb going low) as the memory cell/non-volatile latch stores the bit in the SRAM latch portion formed by M2 103, M3 104, M2' 105, and M3' 106. The access transistors 101, 102 can be turned off by making CLK go low and the electro-magnetic structures (e.g., 110, 111) can be programmed by making WCK go high, resulting in the prog_input signal to go high to program the electro-magnetic structures (e.g., 110, 111) with resistance for a '1'. After programming, WCKb can go back low.

To write a '0' in this implementation, the D and Db signals on the bit and bit-bar lines can go low and high respectively and the CLK signal goes high to turn on the access transistors M1 101 and M1' 102. The low signal from D (and high signal from Db) can pull down nq and pull up nqb. The electromagnetic structure (110, 111) is then programmed by making WCKb high. Since the SRAM latch portion has the low signal on nq (indicating that a '0' is stored), the prog_input swings to the lower rail to program the electro-magnetic structures (110, 111) with a resistance indicative of a '0'.

While Vdd is supplied to the memory, the SRAM latch portion can maintain the value for a '1' or '0'. However, because the electro-magnetic structure was programmed to enhance the SRAM value, when the power is disconnected such as shown around 1 is in the timing diagram, the programmed electro-magnetic structures enable the cells to return to the appropriate value upon reapplying Vdd. That is, once the magneto-electric structures are programmed to a particular resistance level, even when the SRAM is turned off and voltage taken off the cell to save power or close down the chip when not in operation (note both nq and nqb are shown at the low/ground value in the timing diagram), the data for the cell is not lost. Instead, when the power supply returns (such as around 1.35 µs), the resistances of the two magneto-electric structures cause nq and nqb to return to the previous levels. For example, in this case, the cell was storing a '0' so when Vdd goes high again, the resistances of the magneto-electric structures causes nqb to go high while nq remains low. Here, the magneto-electric structure caused the source of transistor M3 104 to hold lower, forcing M3 104 to turn on and holding nq to the lower voltage (and nqb to go high), which flips the SRAM cell into the same state it was in before power-down.

By starting in a balanced condition, additional accuracy can be achieved. Therefore, in many cases, transistor M4 130 with power on signal PON can be included to match the sides of the cell. As shown in the timing diagram, the PON signal can be made low (to turn on the transistor M4 130) right before Vdd is brought back online.

Figure 4A:
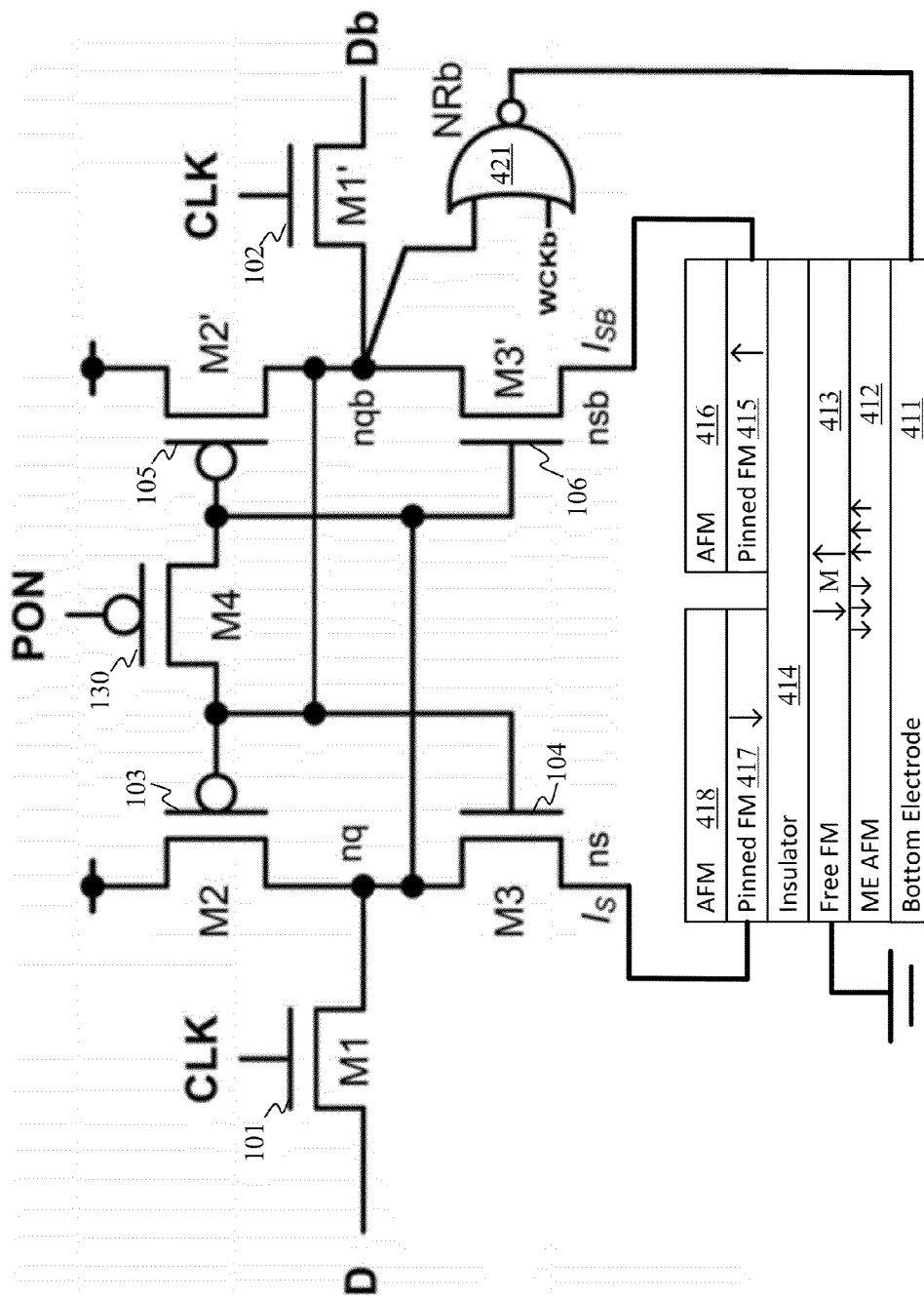
FIGS. 4A and 4B illustrate non-volatile latches having a single programming mechanism with dual output magneto-electric device.
Figure 4B:
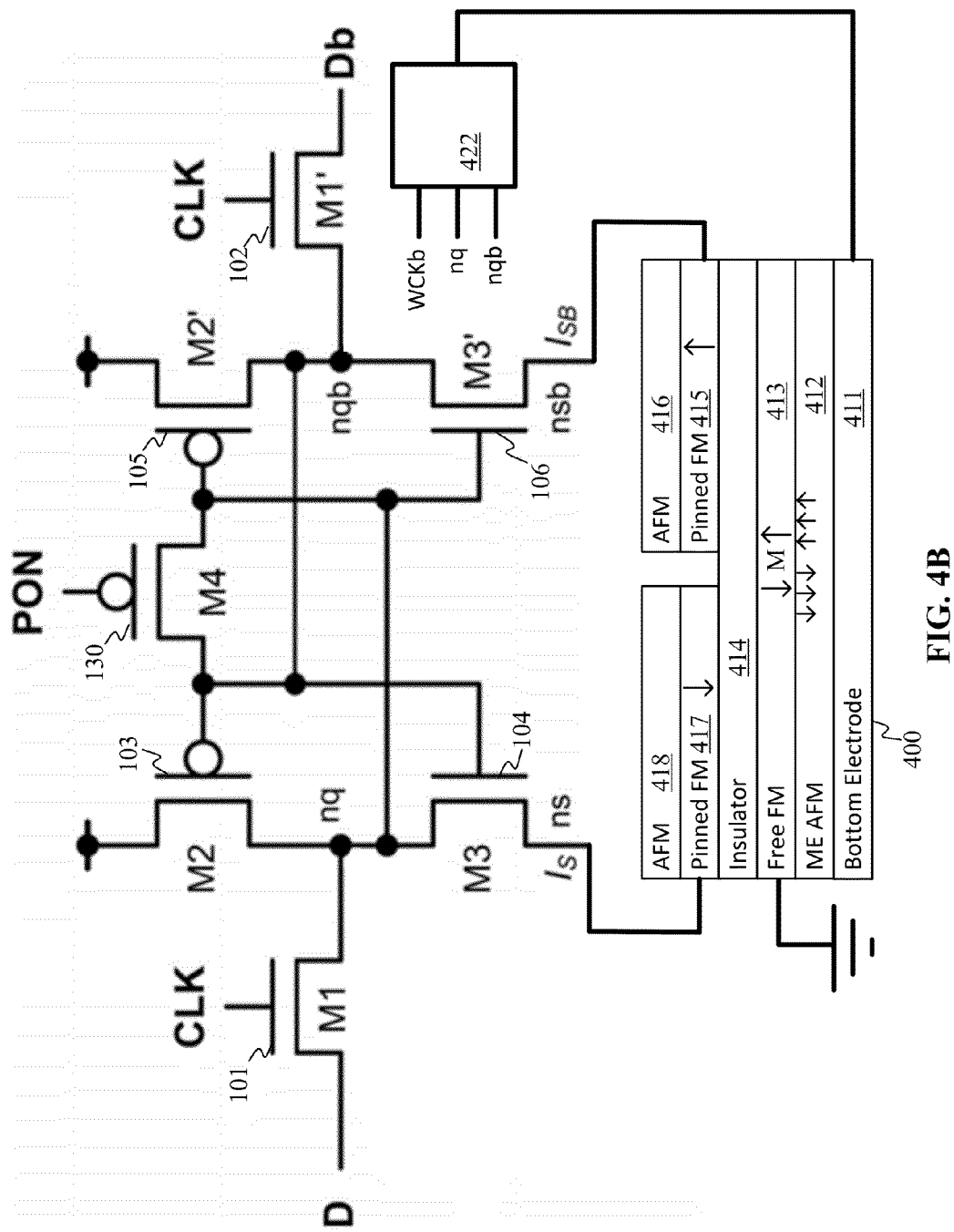

FIGS. 4A and 4B illustrate non-volatile latches having a single programming mechanism with dual output magneto-electric device. In the implementations shown in FIGS. 4A and 4B, the two magneto-electric structures 110, 111 are combined into a structure 400 having a common bottom electrode 411, ME AFM layer 412, free FM layer 413, and insulator 414, where a single NOR gate (e.g., NRb 421) such as shown in FIG. 4A or a single tristate gate 422 (e.g., having circuitry of tristate gate 200) such as shown in FIG. 4B is used to apply a signal to the common bottom electrode 411.

The dual output is accomplished using two pinned layers 415, 416 side-by-side on the insulator 414: one pinned layer 415 with state "up" by the AFM layer 416 and one pinned layer 417 with state "down" by the AFM layer 418. The two pinned layers 415, 417 enable both low resistance and high resistance states from the one device. Reducing the logic count by one NOR gate can reduce required area for each cell. In addition, it may be possible to reduce the magnetoelectric device size by about 50%. The configurations illustrated in FIGS. 1, 2A, 4A, and 4B are suitable for relatively low resistances across the magnetoelectric device(s). For cases where the materials result in a higher resistance across the magnetoelectric device(s), the devices can be connected to the gate of M3 104 and M3' 106 as shown in FIGS. 5A and 5B instead of at the source.

Figure 5A:
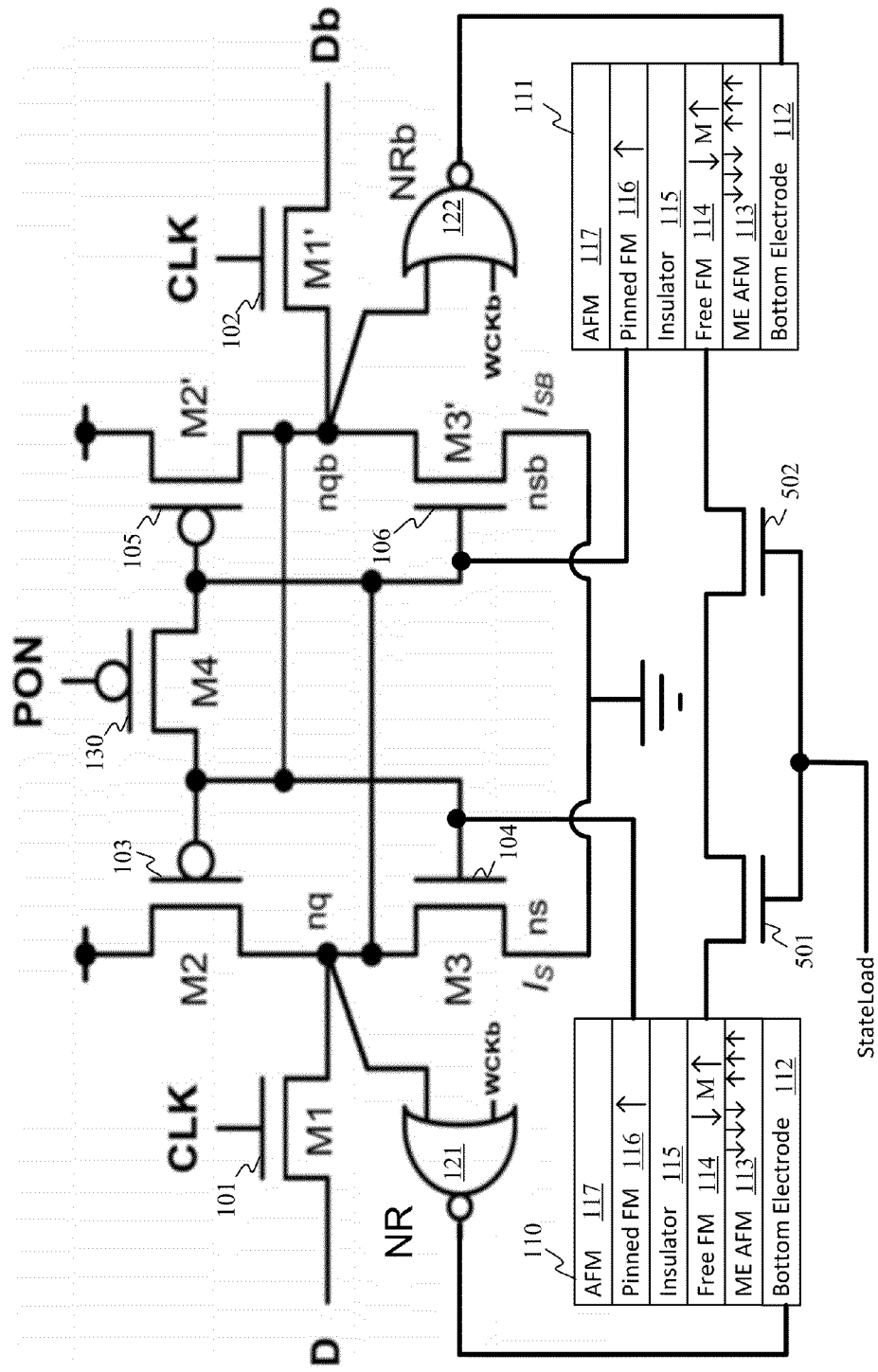
FIGS. 5A and 5B illustrate non-volatile latches suitable for high resistance magneto-electric devices.
Figure 5B:
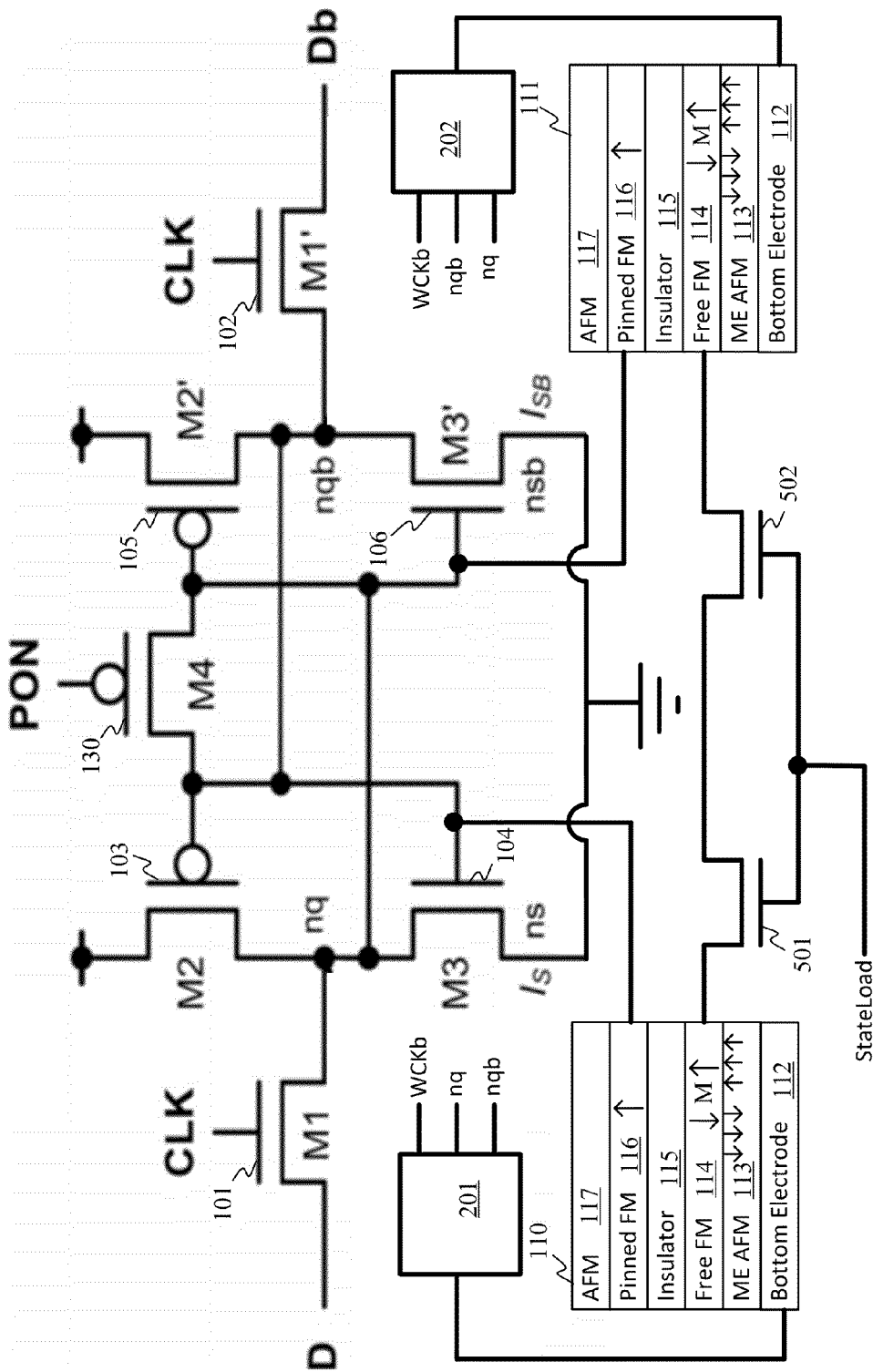

FIGS. 5A and 5B illustrate non-volatile latches suitable for high resistance magneto-electric devices. The configuration shown in FIGS. 5A and 5B can facilitate smaller device structure sizes as well as materials generating a high output resistance or where there are capacitance differences. Similar to the source-connected devices shown in FIGS. 1, 2A, 4A, and 4B, the nonvolatile latches of FIGS. 5A and 5B maintain data in a cell by one side turning on faster than the other due to the state of the ME devices 110, 111. However, in order to respectively connect the pinned FM layers 116 to the gates of M3 104 and M3' 106 instead of to the source lines of M3 104 and M3' 106, state load transistors 501, 502 are used to provide the appropriate potential at the free FM layers 114. A state load signal can be used to turn off the state load transistors 501, 502. The state load signal may be created from the PON signal since the state load transistors 501, 502 are just operated shortly after the PON signal is released. The state load signal may be a local signal or provided as a separate line.

In FIG. 5B, the tristate gates 201, 202 are shown connected with the nq and nqb inputs reversed for the different sides of the circuit. In another implementation, a single tristate gate or two tristate gates having a same nq and nqb input configuration may be used where the direction of the pinned FM layers 116 of structures 110, 111 are in the opposite directions.

Figure 6:
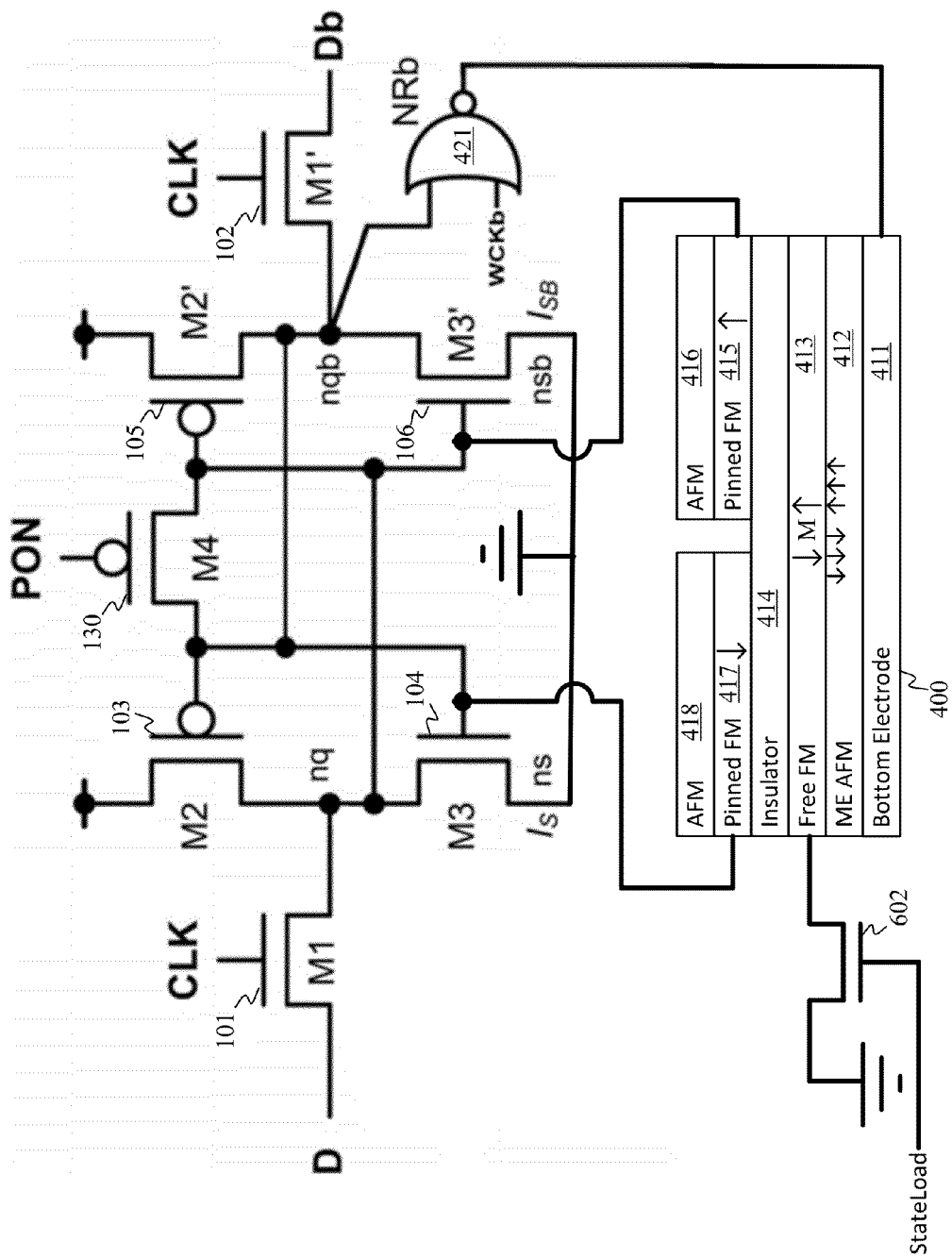
FIG. 6 illustrates an implementation using a dual output high resistance magneto-electric device.

FIG. 6 illustrates an implementation using a dual output high resistance magneto-electric device. In the NOR-based implementation shown in FIG. 6, the free FM layer 413 is combined, the ME AFM layer 412 is combined, and the bottom electrode 411 is combined (the insulator 414 may also be combined). A single state load transistor 602 can be used to provide the appropriate potential at the single free FM layer 413. The pinned FM layers 415, 417 are made to have opposite polarities (e.g., one is high and the other is low by the AFM layers 416, 418). As with the other illustrated implementations, the NOR gate 421 may be replaced with a tristate gate.

Figure 7A:
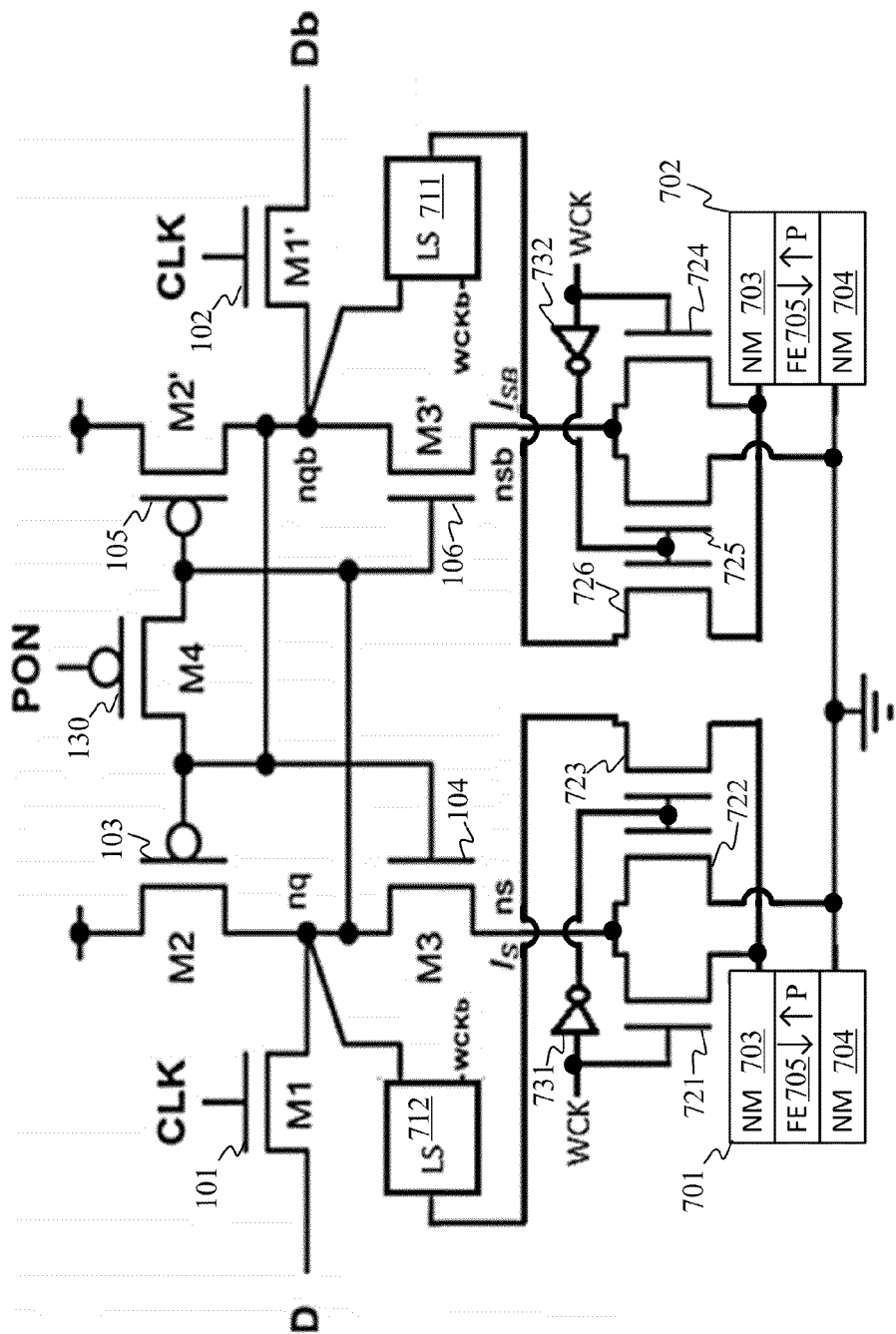
FIG. 7A illustrates a non-volatile latch having two ferro-electric devices according to an example implementation.
Figure 8:
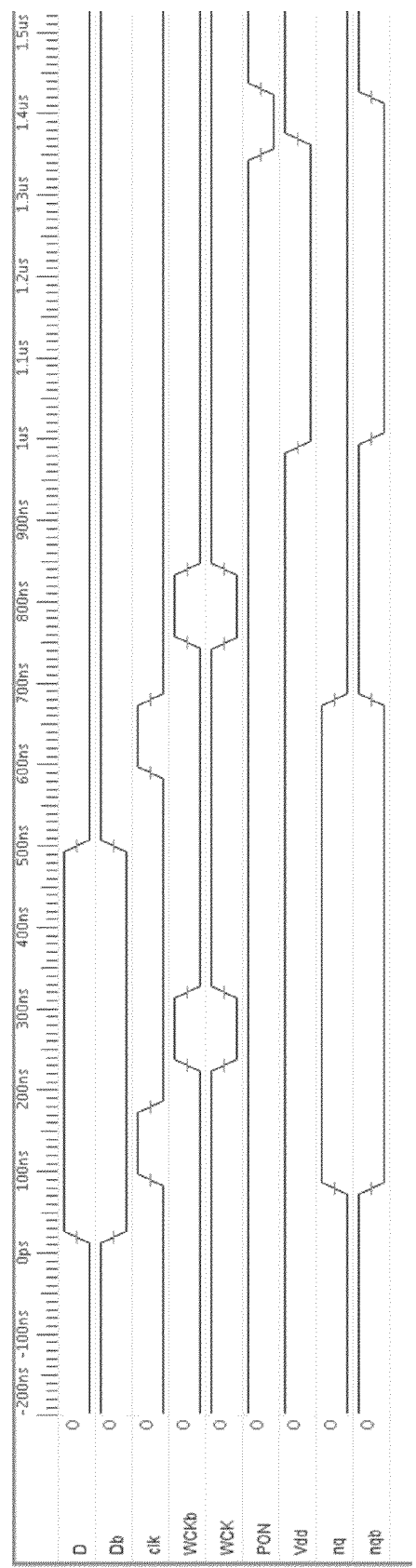
FIG. 8 illustrates a timing diagram that may correspond to operation of the non-volatile latch of FIG. 7A.

FIG. 7A illustrates a non-volatile latch having two ferroelectric devices according to an example implementation; and FIG. 8 illustrates a timing diagram that may correspond to operation of the non-volatile latch of FIG. 7A. Instead of the three-terminal magnetoelectric devices of FIGS. 1-6, a non-volatile latch may alternatively be implemented using a two-terminal ferroelectric device 701, 702 in which a top non-magnetic layer 703 is connected to one node and a bottom non-magnetic layer 704 is connected to the other node with the ferroelectric layer 705 in between the two non-magnetic layers 703, 704.

To write to a ferroelectric device, a positive or negative programming voltage of Vp or -Vp is applied across the device to the top non-magnetic layer 703 (with the bottom non-magnetic layer 704 connected to ground). Then, to read from the ferroelectric device, a read voltage Vr is applied across the device to the top non-magnetic layer 703 (with the bottom non-magnetic layer 704 connected to ground) in order to measure the current through the device. Since the ferroelectric device only has two terminals, a selector mechanism may be used to enable separate programming and reading such as shown in FIG. 7A.

Referring to FIG. 7A, a non-volatile latch using a ferroelectric device to maintain a state of the cell can include a level shifter (LS) 711, 712 controlled by the WCKb line. The level shifter 711, 712 provides an output that ranges from +Vdd to -Vdd, which can be used during programming. This level-shifting circuitry is bypassed during read, for example using a selector mechanism involving pass transistors (e.g., transistors 721, 722, 723, 724, 725, and 726) connected to WCK and WCKb through an inverter 731, 732. Accordingly, the read voltage is respectively applied by the source of M3 104 and M3' 106, and the current through each of the ferroelectric devices 701, 702 is redirected to the latch. In more detail, referring to FIG. 8, data may be written to the cell in a manner conventional to SRAM memory cells with a '1' written using D as high and Db as low. CLK is made high to turn on access transistors M1 101 and M1' 102, resulting in nq going high and nqb going low as the memory cell stores the bit in the SRAM latch portion formed by M2 103, M3 104, M2' 105, and M3' 106.

The access transistors 101, 102 can be turned off by making CLK go low and the ferroelectric structures 701, 702 can be programmed using the level shifters (LS) 711, 712 by making WCKb go high (and WCK go low so the pass transistors 723, 726 connecting the LS to the top non-magnetic layer of the ferroelectric devices turn on and the pass transistors 721, 724 connecting the sources of M3 104 and M3' 106 to their corresponding top non-magnetic layers 703). After programming, WCKb can go back low (and WCK returns to high).

To write a '0' in this implementation, the D and Db signals on the bit and bit-bar lines can go low and high respectively and the CLK signal goes high to turn on the access transistors M1 101 and M1' 102. The low signal from D (and high signal from Db) can pull down nq and pull up nqb. The ferroelectric devices 701, 702 are then programmed by making WCKb high (and connecting the level shifters (LS) 711, 712 to the top non-magnetic layer 703 of the ferroelectric devices 701, 702 through the pass transistors 723, 726).

While Vdd is supplied to the memory, the SRAM latch portion can maintain the value for a '1' or '0'. However, because the ferroelectric devices 701, 702 were programmed to enhance the SRAM value, when the power is disconnected such as shown around 1 is in the timing diagram, the programmed ferroelectric devices 701, 702 enable the cells to return to the appropriate value upon reapplying Vdd. That is, once the ferroelectric devices 701, 702 are programmed, even when the SRAM is turned off and voltage taken off the cell to save power or close down the chip when not in operation (note both nq and nqb are shown at the low/ground value in the timing diagram), the data for the cell is not lost. Instead, when the power supply returns (such as around 1.35 μs), the programmed values at the ferroelectric devices 701, 702 cause nq and nqb to return to the previous levels. For example, in this case, the cell was storing a '0' so when Vdd goes high again, the ferroelectric devices 701, 702 cause nqb to go high while nq remains low.

By starting in a balanced condition, additional accuracy can be achieved. Therefore, in many cases, transistor M4 130 with power on signal PON can be included to match the sides of the cell. As shown in the timing diagram, the PON signal can be made low (to turn on the transistor M4 130) right before (or simultaneously as) Vdd is brought back online.

Figure 7B:
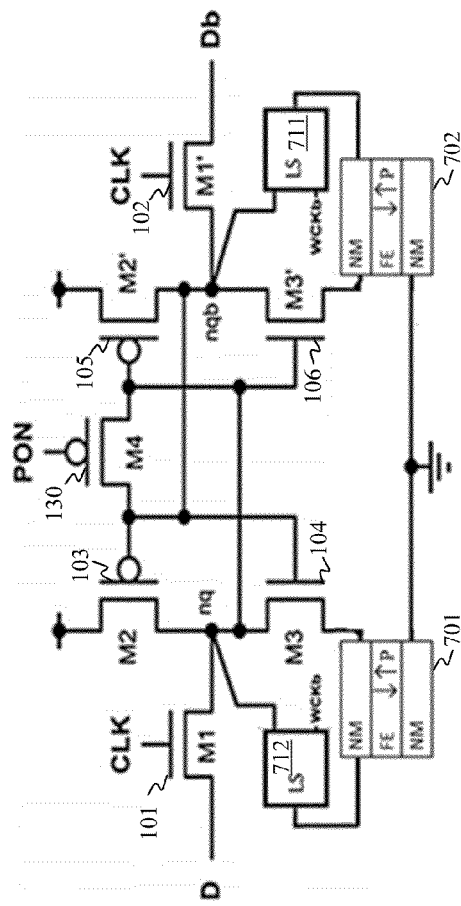
FIG. 7B illustrates a non-volatile latch having two ferro-electric devices according to another example implementation.

FIG. 7B illustrates a non-volatile latch having two ferroelectric devices according to another example implementation. In this case, a selector mechanism like the pass transistors and inverter shown in FIG. 7A is omitted. Control of the switching of the non-volatile ferroelectric state can be carried out by using a smaller voltage and/or shorter time for reading. An example implementation for the circuit shown in FIG. 7B may be carried out in a case where the characteristics of the tunnel junction devices are matched to the CMOS (or other FET) devices for the cell. For example, where the reprogramming of the tunnel junction devices 701, 702 can be accomplished at below the threshold voltage of the transistors M3 104 and M3' 106.

Simplification to the circuitry in the level shifter/interface circuitry, variously referred to in FIG. 2B, or labeled 121, 122, 201, 202, 421, 422, 711, or 712 can be made, depending on the operating voltages of the CMOS and magneto-electric/ferroelectric devices, and whether a global reset is used.

Figure 9:
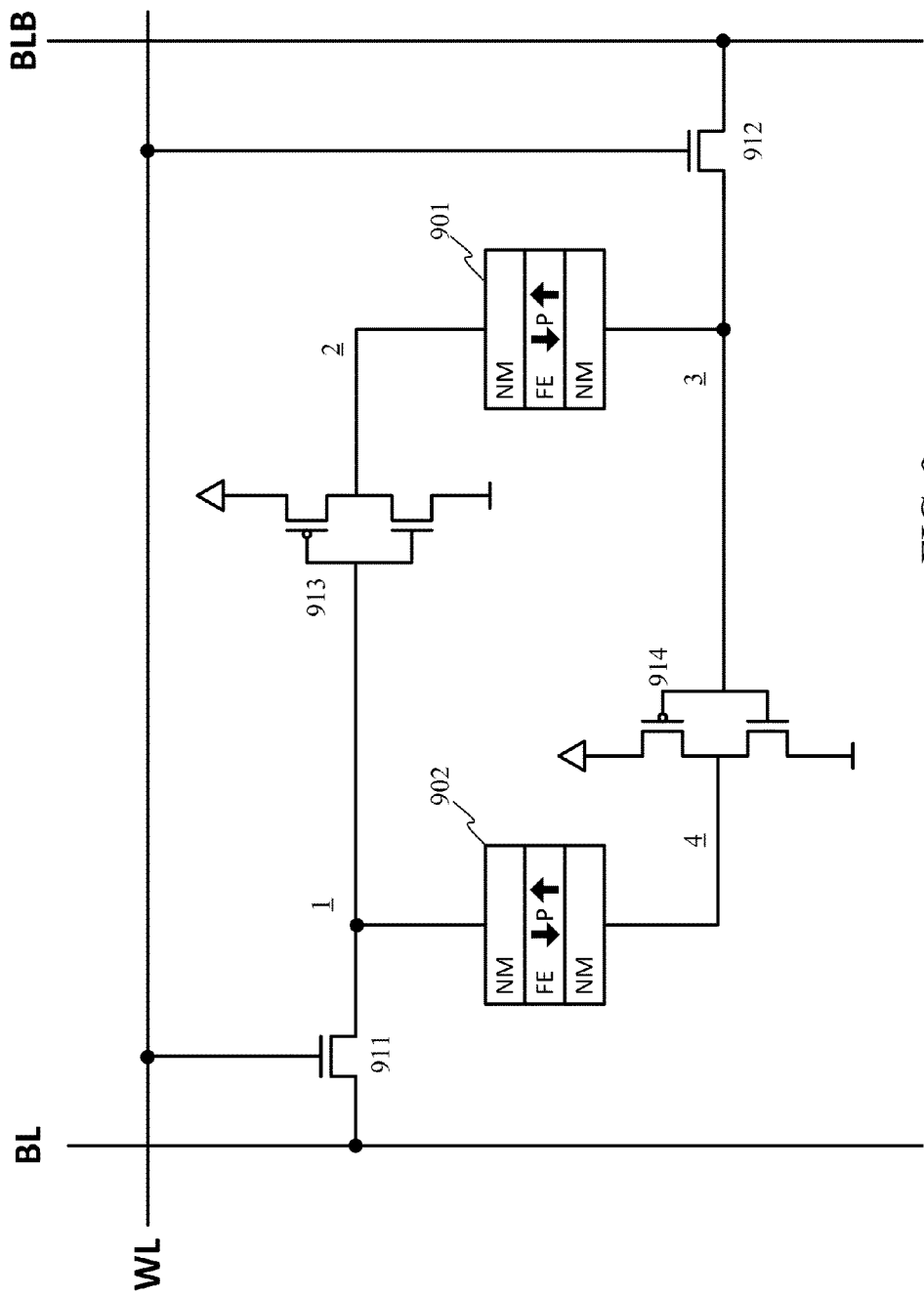
FIG. 9 illustrates an example ferroelectric SRAM cell.

The resistance of the ferroelectric device can also be used to implement a ferroelectric SRAM cell such as shown in FIG. 9. Instead of a spintronic or spin-torque based storage element, a ferroelectric structure is used to enable a 100× change in resistance according to its polarization and provide a non-volatile SRAM with fast switching times as usually desired and available with conventional SRAM devices. Here, a first ferroelectric device 901 is disposed between an output 2 of a first inverter 913 and an internal node 3 connected to an input of the second inverter 914 and a second ferroelectric device 902 is disposed between an output 4 of the second inverter 914 and an internal node 1 connected to the input of the first inverter 913.

Figure 10:
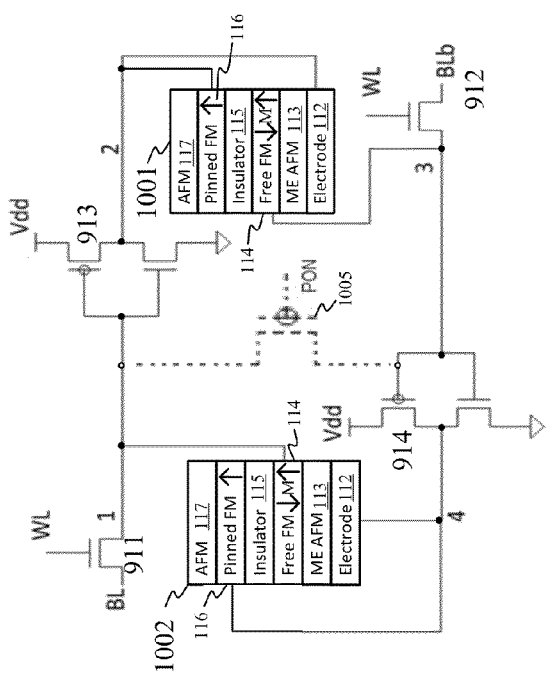
FIG. 10 illustrates an example magnetoelectric SRAM cell.
Figure 11:
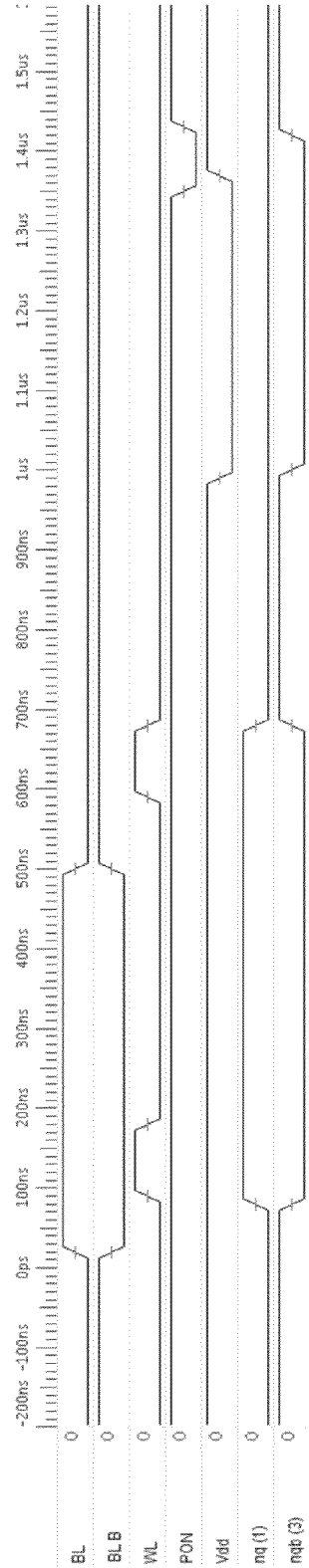
FIG. 11 illustrates a timing diagram that may correspond to operation of the magnetoelectric SRAM cell of FIG. 10.

FIG. 10 illustrates an example magnetoelectric SRAM cell that functions in a similar manner as the ferroelectric SRAM cell of FIG. 9. Here, the bottom electrode 112 and the pinned ferromagnetic layer 116 of one magnetoelectric structure 1001 are both connected to the same node at the output 2 of the first inverter 913 of the SRAM and the free ferromagnetic layer 114 of the magnetoelectric structure 1001 is connected to the internal node nqb (3) coupled to the input of the second inverter 914. Similarly, the bottom electrode 112 and the pinned ferromagnetic layer 116 of the other magnetoelectric structure 1002 are both connected to the same node at the output 4 of the second inverter 914 of the SRAM and the free ferromagnetic layer 114 of this magnetoelectric structure 1002 is connected to the internal node nq (1) coupled to the input of the first inverter 913. A balancing transistor 1005 can be included between the two gates of the p-type transistors of the two invertors 913, 914 (thereby also connected to the two gates of the n-type transistors). The balancing transistor 1005 can help the transistors turn on when there is not much of a difference between the two magnetoelectric devices 1001, 1002 as the power turns on from 0 to vdd. Although the balancing transistor 1005 with PON input is shown as an option in the example illustrated in FIG. 10, this balancing transistor may also optionally be included for the ferroelectric SRAM cell of FIG. 9. FIG. 11 illustrates a timing diagram suitable for both the FE SRAM cell and the ME SRAM cell.

In particular, referring to the timing diagram of FIG. 11, BL and BLb are the signals from the bit and bit-bar line, which are written into the memory cell. When writing a '1' (BL is high and BLb is low), WL is made high to turn on the access transistors 911 and 912. This results in the voltage at node 1 (nq) going high (and node 3 (nqb) going low). The access transistors 911 and 912 can be turned off by making WL go low. The resistances of the FE or ME devices are controlled by the voltages between node 2 at the output of the inverter 913 and node 3 and the voltages between node 4 at the output of the inverter 914 and node 1.

To write a '0' in this implementation, the BL and BLb signals on the bit and bit-bar lines can go low and high respectively and the WL signal goes high to turn on the access transistors 911 and 912. The low signal from BL (and high signal from BLb) can pull down nq at node 1 and pull up nqb at node 3. The FE or ME device is programmed (e.g., having its resistance controlled) during the normal operation by the voltages across the nodes 2 and 3 and across the nodes 4 and 1.

While Vdd is supplied to the memory, the SRAM can maintain the value for a '1' or '0'. Then, when the power is disconnected such as shown around 1 μs in the timing diagram, the resistances programmed into the FE or ME devices enable the cells to return to the appropriate value upon reapplying Vdd. That is, once the FE or ME structures are programmed to a particular resistance level, even when the voltage is taken off the cell to save power or close down the chip when not in operation (note both nq and nqb are shown at the low/ground value in the timing diagram), the data for the cell is not lost. Instead, when the power supply returns (such as around 1.35 µs), the resistances of the two FE or ME devices cause node 1 (nq) and node 3 (nqb) to return to the previous levels. For example, in this case, the cell was storing a '0' so when Vdd goes high again, the resistances of the FE or ME devices cause node 3 (nqb) to go high while node 1 (nq) remains low.

A memory controller can be provided to control the write and read processes, as well as any specified clock signals illustrated in any of the timing diagrams shown herein. Aspects of the memory controller may be provided on a memory chip itself, as part of a separate chip, or even with parts on both the memory chip and the separate chip. Existing SRAM support circuitry can be leveraged.

It should be understood that the examples and embodiments described herein are for illustrative purposes only and that various modifications or changes in light thereof will be suggested to persons skilled in the art and are to be included within the spirit and purview of this application.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A non-volatile memory circuit comprising:
a first access transistor, a second access transistor, a first inverter having a first n-type transistor and a first p-type transistor, a second inverter having a second n-type transistor and a second p-type transistor, at least one magnetic device, and a programming logic,
wherein the first access transistor connects a bit line to a first output node of the first inverter under control of a word line coupled to a gate of the first access transistor,
wherein the second access transistor connects a bit bar line to a second output node of the second inverter under control of the word line coupled to a gate of the second access transistor,
wherein the first output node is coupled to a second input node of the second inverter and the second output node is coupled to a first input node of the first inverter,
wherein the at least one magnetic device is coupled to the first n-type transistor and the second n-type transistor, and
wherein the programming logic is coupled to at least one of the first output node and the second output node to program the at least one magnetic device,
wherein the at least one magnetic device comprises a first magneto-electric device and a second magneto-electric device, wherein a first bottom electrode of the first magneto-electric device receives an output of the programming logic coupled to the first output node, wherein a second bottom electrode of the second magneto-electric device receives an output of the programming logic coupled to the second output node, wherein a first free ferromagnetic (FM) layer of the first magneto-electric device and a second free FM layer of the second magneto-electric device are coupled to each other, wherein a first pinned FM layer having a first polarity is coupled to the first n-type transistor, and wherein a second pinned FM layer having a second polarity opposite the first polarity is coupled to the second n-type transistor.

2. The non-volatile memory of claim 1, wherein the first pinned FM layer is coupled to a source of the first n-type transistor, and wherein the second pinned FM layer is coupled to a source of the second n-type transistor.

3. The non-volatile memory of claim 1, wherein the first free FM layer and the second free FM layer are coupled to ground.

4. The non-volatile memory of claim 1, wherein the first pinned FM layer is coupled to a gate of the first n-type transistor, and wherein the second pinned FM layer is coupled to a gate of the second n-type transistor.

5. The non-volatile memory of claim 4, further comprising a first state load transistor and a second state load transistor connected in series between the first free FM layer and the second free FM layer.

6. The non-volatile memory of claim 1, wherein the programming logic comprises:
a first NOR gate having a first input coupled to the first output node, a second input receiving a programming signal, and a first output coupled to the first bottom electrode to provide the output of the programming logic coupled to the first output node; and
a second NOR gate having a third input coupled to the second output node, a fourth input receiving the programming signal, and a second output coupled to the second bottom electrode to provide the output of the programming logic coupled to the second output node.

7. The non-volatile memory of claim 1, wherein the programming logic comprises:
a first tristate gate having a first input coupled to the first output node, a second input coupled to the second output node, a third input receiving a programming signal, and a first output coupled to the first bottom electrode to provide the output of the programming logic coupled to the first output node.

8. The non-volatile memory of claim 7, wherein the first tristate gate comprises:
a first transmission gate controlled by the programming signal to pass a vss or ground signal to the first bottom electrode via the first output;
a cross-coupled pair of n-type transistors;
a third p-type transistor common-source-connected to the cross-coupled pair of n-type transistors and coupled at its gate to the first output node;
a fourth p-type transistor common-source-connected to the cross-coupled pair of n-type transistors and coupled at its gate to the second output node;
a second transmission gate controlled by an inverse of the programming signal to pass a signal from the first output node or the second output node through the third p-type transistor and fourth p-type transistor to the first bottom electrode via the first output.

9. A non-volatile memory circuit comprising:
a first access transistor, a second access transistor, a first inverter having a first n-type transistor and a first p-type transistor, a second inverter having a second n-type transistor and a second p-type transistor, at least one magnetic device, and a programming logic,
wherein the first access transistor connects a bit line to a first output node of the first inverter under control of a word line coupled to a gate of the first access transistor, wherein the second access transistor connects a bit bar line to a second output node of the second inverter under control of the word line coupled to a gate of the second access transistor, wherein the first output node is coupled to a second input node of the second inverter and the second output node is coupled to a first input node of the first inverter, wherein the at least one magnetic device is coupled to the first n-type transistor and the second n-type transistor, and wherein the programming logic is coupled to at least one of the first output node and the second output node to program the at least one magnetic device, wherein the at least one magnetic device comprises a dual output magneto-electric device comprising a bottom electrode that receives an output of the programming logic coupled to the second output node, a free FM layer, a first pinned FM layer having a first polarity and that is coupled to the first n-type transistor, and a second pinned FM layer having a second polarity opposite the first polarity and that is coupled to the second n-type transistor.

10. The non-volatile memory of claim 9, wherein the first pinned FM layer is coupled to a source of the first n-type transistor, and wherein the second pinned FM layer is coupled to a source of the second n-type transistor.

11. The non-volatile memory of claim 9, wherein the first pinned FM layer is coupled to a gate of the first n-type transistor, and wherein the second pinned FM layer is coupled to a gate of the second n-type transistor.

12. The non-volatile memory of claim 11, further comprising a state load transistor series connected between a ground and the free FM layer.

13. The non-volatile memory of claim 9, wherein the programming logic comprises:
a NOR gate having a first input coupled to the second output node, a second input receiving a programming signal, and a first output coupled to the bottom electrode to provide the output of the programming logic.

14. The non-volatile memory of claim 9, wherein the programming logic comprises:
a first tristate gate having a first input coupled to the first output node, a second input coupled to the second output node, a third input receiving a programming signal, and a first output coupled to the bottom electrode.

15. The non-volatile memory of claim 14, wherein the first tristate gate comprises:
a first transmission gate controlled by the programming signal to pass a vss or ground signal to the bottom electrode via the first output;
a cross-coupled pair of n-type transistors;
a third p-type transistor common-source-connected to the cross-coupled pair of n-type transistors and coupled at its gate to the first output node;
a fourth p-type transistor common-source-connected to the cross-coupled pair of n-type transistors and coupled at its gate to the second output node;
a second transmission gate controlled by an inverse of the programming signal to pass a signal from the first output node or the second output node through the third p-type transistor and fourth p-type transistor to the bottom electrode via the first output.

16. The non-volatile memory circuit of claim 1, wherein the first access transistor, the second access transistor, the first inverter, and the second inverter form a static random access memory (SRAM) cell, wherein the SRAM cell is provided in plurality as an array of SRAM cells, each SRAM cell of the array of SRAM cells having a corresponding at least one magnetic device and programming logic.

17. A non-volatile memory circuit comprising:
a first access transistor, a second access transistor, a first inverter having a first n-type transistor and a first p-type transistor, a second inverter having a second n-type transistor and a second p-type transistor, a first ferroelectric device, a second ferroelectric device, a programming logic, and a bypass logic to bypass the programming logic during non-programming operation, wherein the first access transistor connects a bit line to a first output node of the first inverter under control of a word line coupled to a gate of the first access transistor, wherein the second access transistor connects a bit bar line to a second output node of the second inverter under control of the word line coupled to a gate of the second access transistor, wherein the first output node is coupled to a second input node of the second inverter and the second output node is coupled to a first input node of the first inverter, wherein the first ferroelectric device is coupled to the first n-type transistor and the second ferroelectric device is coupled to the second n-type transistor, and wherein the programming logic is coupled to the first output node to program the first ferroelectric device and is coupled to the second output node to program the second ferroelectric device.

18. A non-volatile memory cell, comprising:
a first access transistor,
a second access transistor,
a first inverter having an input and an output,
a second inverter having an input and an output,
a first ferroelectric device comprising a first non-magnetic layer, a second non-magnetic layer, and a first ferroelectric layer between the first non-magnetic layer and the second non-magnetic layer, and
a second ferroelectric device comprising a third non-magnetic layer, a fourth non-magnetic layer, and a second ferroelectric layer between the third non-magnetic layer and the fourth non-magnetic layer,
wherein the first inverter is connected at its output to the first non-magnetic layer of the first ferroelectric device, and
wherein the second non-magnetic layer of the first ferroelectric device is connected to an input node that is connected to both the second access transistor and the input of the second inverter, and
wherein the second inverter is connected at its output to the third non-magnetic layer of the second ferroelectric device, and
wherein the fourth non-magnetic layer of the second ferroelectric device is connected to an input node that is connected to both the first access transistor and the input of the first inverter.

19. A non-volatile memory cell, comprising:
a first access transistor,
a second access transistor,
a first inverter having an input and an output,
a second inverter having an input and an output,
a first magnetoelectric device comprising a first bottom electrode, a first pinned ferromagnetic (FM) layer, and a first free FM layer, and
a second magnetoelectric device comprising a second bottom electrode, a second pinned FM layer, and a second free FM layer, wherein the first inverter is connected at its output to the first pinned FM layer and the first bottom electrode of the first magnetoelectric device, and wherein the first free FM layer is connected to an input node connected to both the second access transistor and the input of the second inverter, and wherein the second inverter is connected at its output to the second pinned FM layer and the second bottom electrode of the second magnetoelectric device, and wherein the second free FM layer of the second magnetoelectric device is connected to an input node connected to both the first access transistor and the input of the first inverter.

* * * * *